United States Patent [19]

Sasaki

[11] Patent Number: 5,357,248

[45] Date of Patent: Oct. 18, 1994

[54] SAMPLING RATE CONVERTER

[75] Inventor: Takeshi Sasaki, Kanagawa, Japan

[73] Assignee: Sony Corporation, Tokyo, Japan

[21] Appl. No.: 39,528

[22] Filed: Mar. 29, 1993

Related U.S. Application Data

[63] Continuation of Ser. No. 704,393, May 23, 1991, abandoned.

[30] Foreign Application Priority Data

May 25, 1990 [JP] Japan .................................. 2-134167

[51] Int. Cl.$^5$ ............................................. H03M 5/10
[52] U.S. Cl. ..................................................... 341/61
[58] Field of Search ................ 341/61, 122, 123, 124, 341/125; 375/21, 22, 23, 24

[56] References Cited

U.S. PATENT DOCUMENTS

| | | | |
|---|---|---|---|
| 3,928,823 | 12/1975 | Gingell | 341/76 |
| 4,109,110 | 8/1978 | Gingell | 341/144 |
| 4,630,034 | 12/1986 | Takahashi | 341/61 |
| 4,954,824 | 9/1990 | Yamada et al. | 341/61 |

*Primary Examiner*—Brian K. Young
*Attorney, Agent, or Firm*—Hill, Steadman & Simpson

[57] ABSTRACT

A sampling rate converter has a pulse-dulation modulator for converting a pulse-code-modulated signal, which has been sampled with a first sampling frequency, into a pulse-dulation-modulated signal, and a counter for counting pulses of the pulse-dulation-modulated signal and producing a count in each sampling period determined by a second sampling frequency. The sampling rate converter also includes a multiplier connected to the output of the counter.

4 Claims, 3 Drawing Sheets

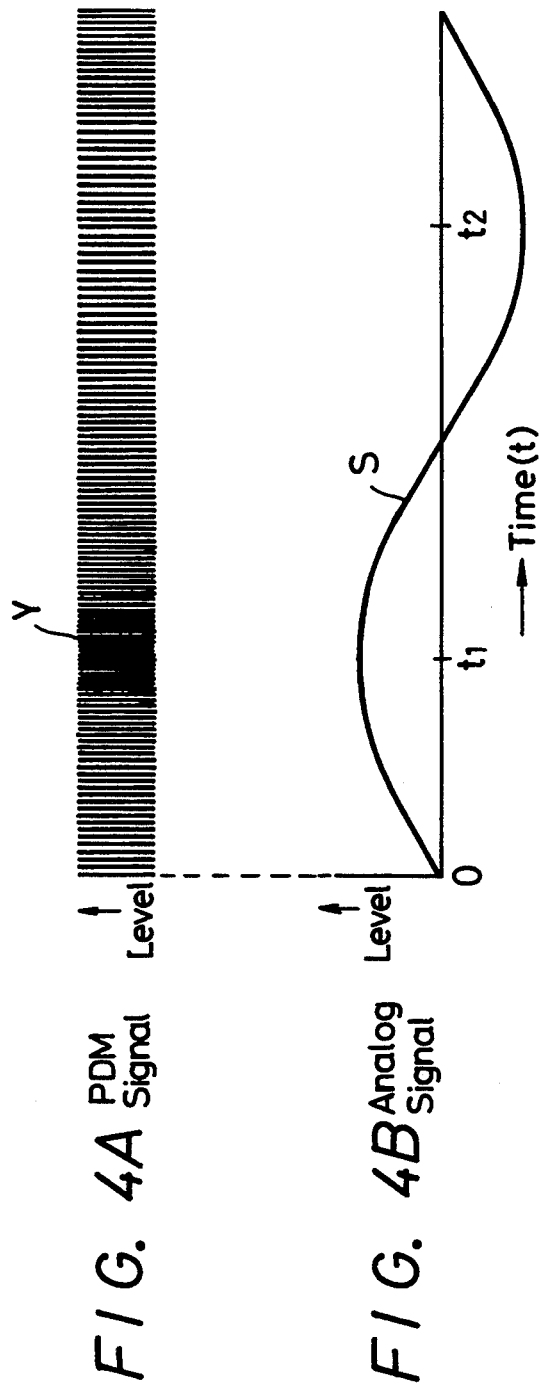
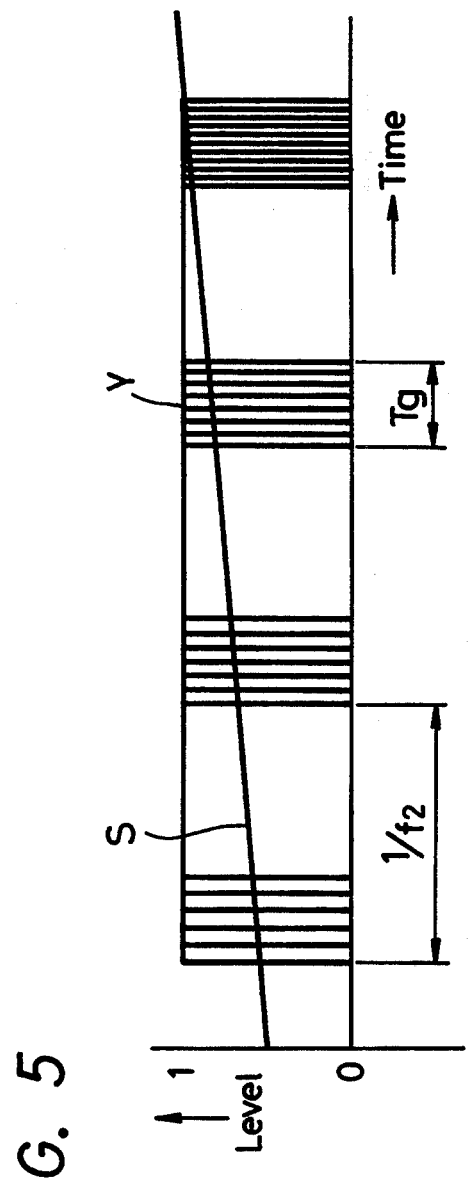

SAMPLING RATE CONVERTER

This is a continuation of application Ser. No. 07/704,393, filed May 23, 1991 now abandoned.

BACKGROUND OF THE INVENTION

1. Field of the Invention

The present invention relates to a sampling rate converter of a simple circuit arrangement, and more particularly to a sampling rate converter suitable for use in a digital audio device.

2. Description of the Prior Art

There is known a sampling rate converter employing a digital filter, as disclosed in Japanese Laid-Open Patent Publication No. 57-115015, for example.

FIG. 1 of the accompanying drawings shows a conventional sampling rate converter. The sampling rate converter shown in FIG. 1 includes a time difference measuring circuit 1 for measuring the time difference between an input sampling rate and an output sampling rate (i.e., the phase difference between sampling clock pulses for input data and sampling clock pulses for output data). The time difference information from the time difference measuring circuit 1 is supplied to a time difference to coefficient converter 2, and converted thereby into a filter coefficient, which is then supplied to a sampling filter (digital filter) 3. As shown in detail in FIG. 2, the time difference measuring circuit 1 comprises a phase-locked loop 4 and a counter 5. The time difference measuring circuit 1 starts counting clock pulses in response to a signal indicative of the input sampling rate and stops counting clock pulses in response to a signal indicative of the output sampling rate. When the time difference measuring circuit 1 stops counting clock pulses, it supplies its count represented by parallel data to the time difference to coefficient converter 2. The phase-locked loop 4 supplies the counter 5 with a frequency signal, as clock pulses, which is held in phase with the input sampling rate signal.

To increase the sampling rate with the sampling filter 3 in FIG. 1, sampled values of zero (or linearly interpolated values) are inserted between the original sampled values, providing a new sampled sequence, which is then processed by the sampling filter 3 at a higher sampling rate. In this manner, the output sampling rate can be increased. If the sampling rate is to be increased in a number of steps, then the above process has to be repeated a plurality of times. Therefore, the entire processing operation is complex, and the required circuit arrangement is also complex.

OBJECTS AND SUMMARY OF THE INVENTION

It is an object of the present invention to provide a sampling rate converter having a simple circuit arrangement.

According to the present invention, there is provided a sampling rate converter comprising a pulse-density modulator for converting a pulse-code-modulated (PCM) signal, which has been sampled with a first sampling frequency, into a pulse-density-modulated (PDM) signal, and a counter for counting pulses of the pulse-density-modulated signal and producing a count in each sampling period determined by a second sampling frequency.

The sampling rate converter also includes a multiplier connected to the output of the counter.

The pulse-dulation modulator produces a PDM signal whose pulse density is high when the level of the PCM signal is high, and an output pulse signal is produced from the PDM signal at a desired sampling rate. The sampling rate converter is of a simple circuit arrangement.

The multiplier connected to the output of the counter is capable of adjusting the level of the output signal depending on the clock signal frequency in the pulse-density modulator.

The above and other objects, features, and advantages of the present invention will become apparent from the following detailed description of an illustrative embodiment thereof to be read in conjunction with the accompanying drawings, in which like reference numerals represent the same or similar objects.

BRIEF DESCRIPTION OF THE DRAWINGS

FIGS. 4A and 4B are diagrams illustrative of operation of a pulse-density modulator (PDM) in the sampling rate converter shown in FIG. 3; and FIG. 5 is a diagram showing the manner in which a counter in the sampling rate converter shown in FIG. 3 operates.

DETAILED DESCRIPTION OF THE PREFERRED EMBODIMENT

Figure 1:
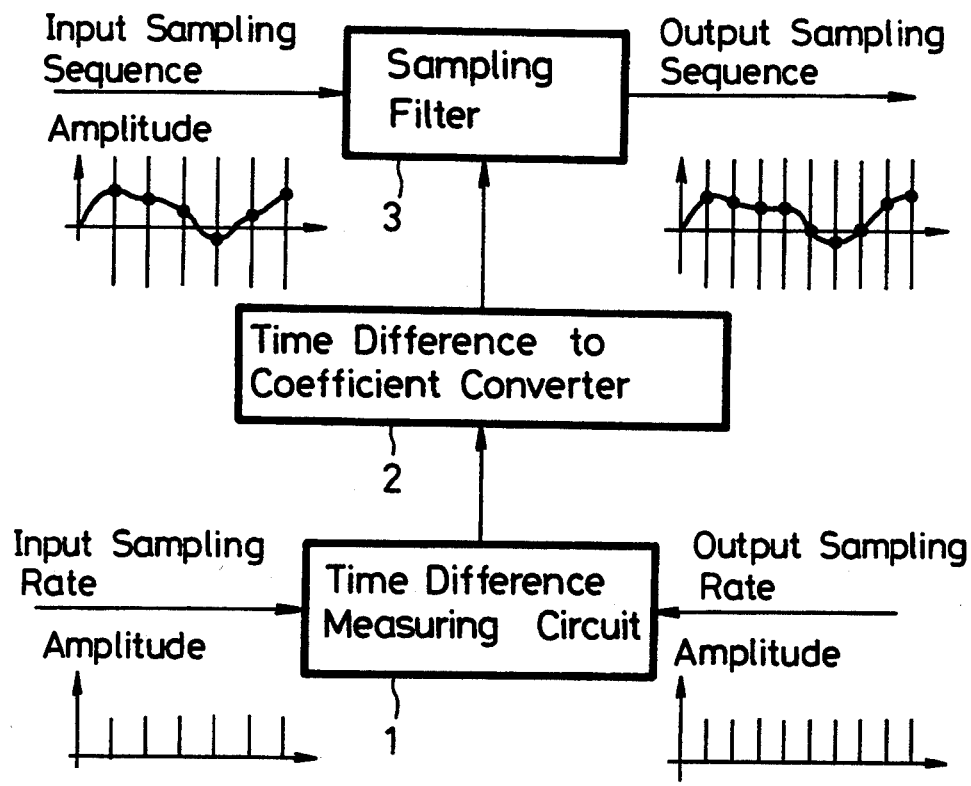
FIG. 1 is a block diagram of a conventional sampling rate converter.
Figure 2:
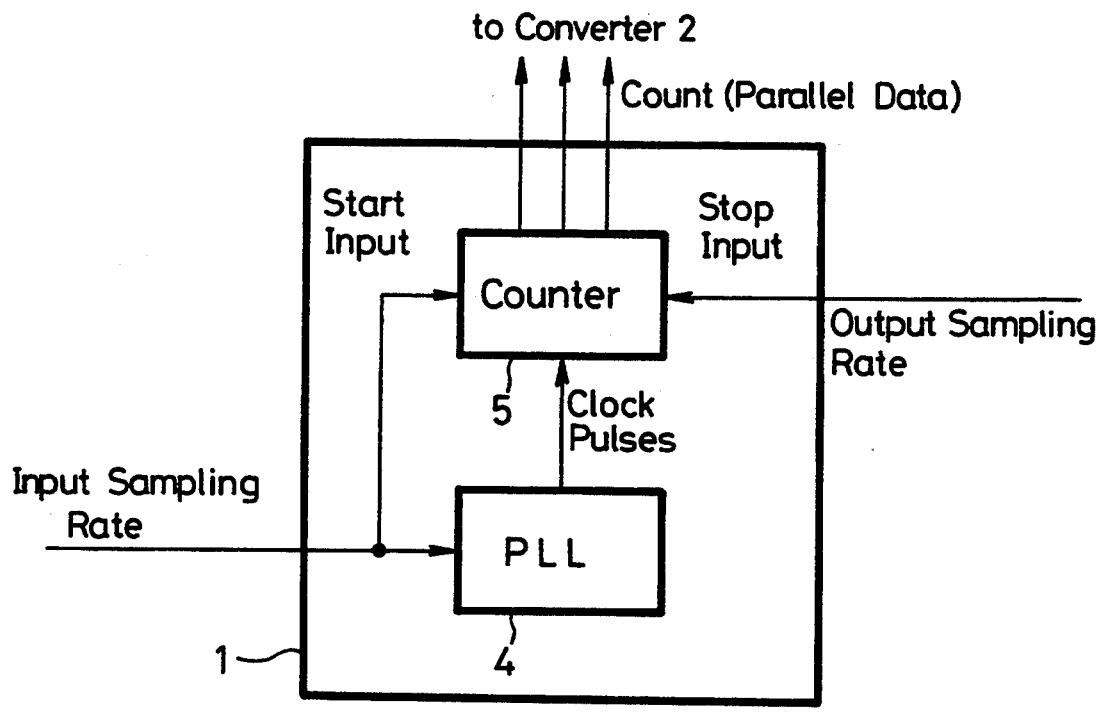
FIG. 2 is a block diagram of a time difference measuring circuit in the sampling rate converter shown in FIG. 1.
Figure 3:
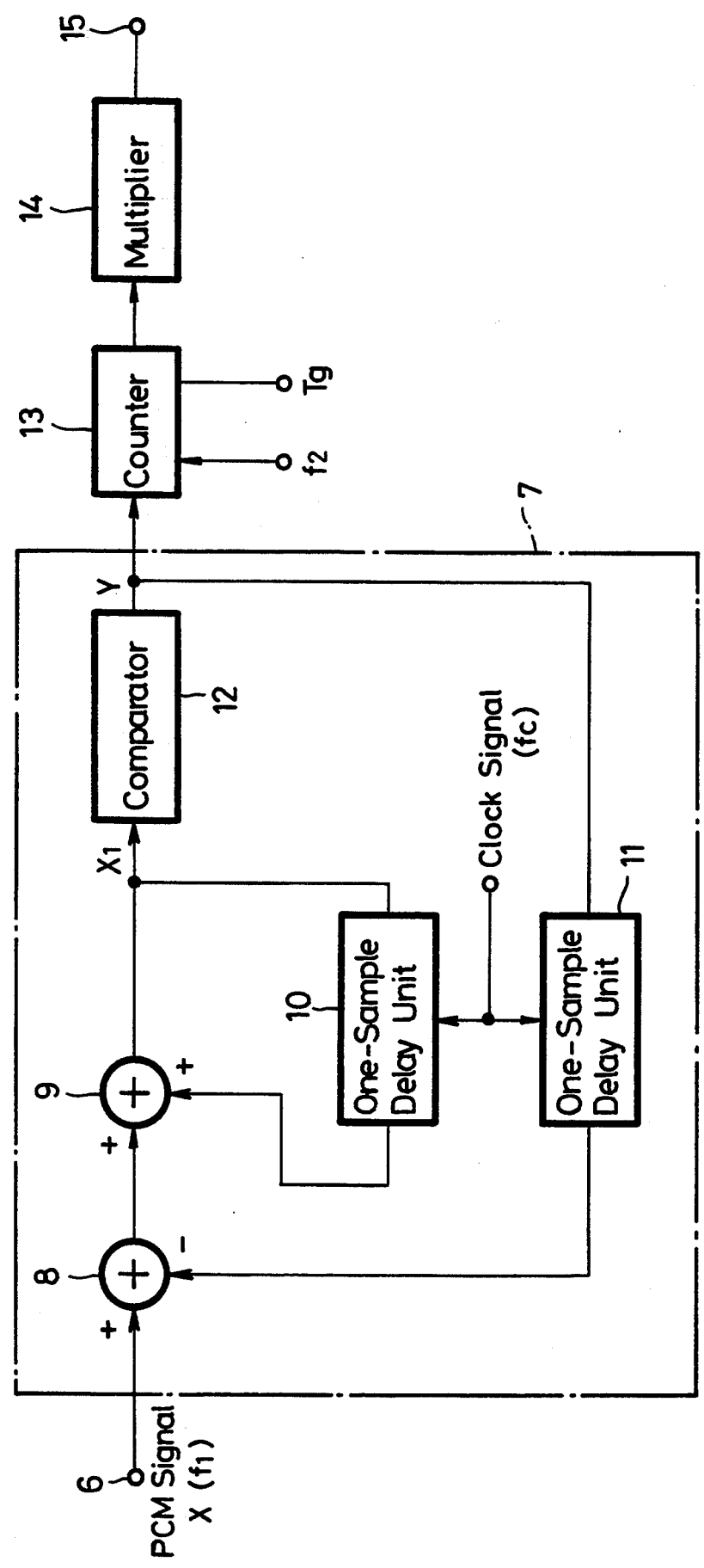
FIG. 3 is a block diagram of a sampling rate converter according to the present invention.

FIG. 3 shows a sampling rate converter according to the present invention.

The sampling rate converter shown in FIG. 3 has an input terminal supplied with a pulse-code-modulated (PCM) signal which has been sampled with a first sampling frequency f1. The sampling rate converter includes a pulse-density modulator (PDM) 7 which is shown as effecting noise shaping of a first order, by way of example. The pulse-dulation modulator 7 comprises an adder 8, an adder 9, a pair of one-sample delay units 10, 11, and a comparator 12. The sampling rate converter also includes a counter 13 for producing a count in each sampling period (1/f2) which is determined by a second sampling frequency f2, and a multiplier 14 for adjusting the level of an output signal at an output terminal 15 depending on the ratio between the first and second sampling frequencies f1, f2.

It is assumed that the PCM signal supplied to the input terminal 6 is indicated by X, the adder 9 produces an output signal X1, the comparator 12 produces an output signal Y, the one-sample delay units 10, 11 has a one-sample delay $Z^{-1}$, and the one-sample delay units 10, 11 are supplied with a clock signal which has a frequency fc and a period $T = 1/fc$. The following equations are now satisfied:

$$X1 = X - Y \cdot Z^{-1} + X1 \cdot Z^{-1} \quad (1)$$

$$X1 = Y + QN \quad (2)$$

where $Z^{-1} = \cos\omega T - j \sin\omega T$, and $$\omega T = 2\pi fcT,$$

and $$Y = X + QN(1 - Z^{-1}) \quad (3)$$

If $\omega T$ is small in the equation (3), i.e., if the period $T(1/fc)$ of the clock signal is short, the value of $Z^{-1}$ approximates 1, and $Y \approx X$. The PCM signal X supplied to the input terminal 6 may be a 16-bit PCM signal, for example, and the output signal Y produced by the comparator 12 may be a 1-bit pulse-density-modulated (PDM) signal which has been subjected to noise shaping.

FIG. 4A shows the PDM signal produced by the pulse-density modulator 7, and FIG. 4B shows an analog signal S from which the PCM signal X is produced. FIGS. 4A and 4B indicate that the higher the level of the analog signal S, the higher the density of the pulses of the PDM signal Y.

To convert the 16-bit PCM signal X into a 1-bit signal, if the first sampling frequency is 44.1 kHz, then the frequency fc of the clock signal is required to be 44.1 kHz $\times (2^{16} - 1) \approx 3$ GHz when the 16-bit PCM signal is of a full positive code (i.e., all offset binary digits are 1). If an oversampling frequency which is 128 times higher than f1 = 44.1 kHz (the frequency fc of the clock signal is about 6 MHz) is used, then a resolution corresponding to 18 bits can be obtained.

FIG. 5 illustrates the manner in which the counter 13 operates. In FIG. 5, pulses of the output signal of the comparator 12 are counted by the counter 13 in a counting time Tg thereof, and the count is supplied to the multiplier 14 in each sampling period (1/f2) determined by the second sampling frequency f2.

When the PCM signal is at its peak, or the first sampling frequency is high and the clock signal frequency fc is high, the density of the pulses of the PDM signal is also high. The multiplier 14 has its coefficient selected so that the output signal at the output terminal 15 is of a full positive code (i.e., all offset binary digits are 1 at a positive peak of the analog signal S). As a result, the PCM signal X sampled with the first sampling frequency f1 (e.g., 44.1 kHz) is converted into a signal sampled with the second sampling frequency f2 (e.g., 48 kHz), and the latter signal is provided as the output signal from the multiplier 14.

With the present invention, as described above, the pulse-density modulator 7 produces a PDM signal whose pulse density is high when the level of the PCM signal is high, and an output pulse signal is produced from the PDM signal at a desired sampling rate. The sampling rate converter according to the present invention is of a simple circuit arrangement. The multiplier connected to the output of the counter is capable of adjusting the level of the output signal depending on the clock signal frequency in the pulse-density modulator 7.

Although a certain preferred embodiment has been shown and described, it should be understood that many changes and modifications may be made therein without departing from the scope of the appended claims.

I claim as my invention:

1. A sampling rate converter comprising:
   a pulse-density modulator for converting a pulse-code-modulated signal, which has been sampled with a first sampling frequency, into a pulse-density-modulated signal;
   a counter for counting pulses of said pulse-density-modulated signal and producing a count at each sampling period determined by a second sampling frequency;
   said pulse-density-modulator comprising adder means, and comparator means having an input connected to an output of said adder means, and a one-sample delay unit having an input connected to an output of said adder unit, and an output of said one-sample delay unit being connected to a second input of said adder means.

2. A sampling rate converter according to claim 1, including a second one-sample delay unit having an input connected to an output of said comparator, and second adder means, said second adder means having an output connected to an input of said first adder means, and an input connected to an output of said second one-sample delay unit.

3. A sampling rate converter comprising:
   a pulse-density-modulator for converting a pulse-code-modulated signal, which has been sampled with a first sampling frequency, into a pulse-density-modulated signal; and
   a counter for counting pulses of said pulse-density-modulated signal and producing a count in each sampling period determined by a second sampling frequency;
   said pulse-density-modulator producing pulses in the form of a single bit pulse-density-modulated signal, and said counter accumulating said single bit pulse-density-modulated pulses during each cycle of said second sampling frequency.

4. A sampling rate converter according to either of claims 1 or 3, further including a multiplier connected to the output of said counter, for multiplying the count produced by said counter by a coefficient to provide as an output thereof a full positive code.

* * * * *